United States Patent
Wang

(10) Patent No.: US 12,219,840 B2
(45) Date of Patent: Feb. 4, 2025

(54) ELECTRONIC DEVICE, DISPLAY APPARATUS, DISPLAY SUBSTRATE AND MANUFACTURING METHOD THEREFOR

(71) Applicants: Chengdu BOE Optoelectronics Technology Co., Ltd., Sichuan (CN); BOE TECHNOLOGY GROUP CO., LTD., Beijing (CN)

(72) Inventor: Yang Wang, Beijing (CN)

(73) Assignees: Chengdu BOE Optoelectronics Technology Co., Ltd., Sichuan (CN); BOE TECHNOLOGIES GROUP CO., LTD., Beijing (CN)

( * ) Notice: Subject to any disclaimer, the term of this patent is extended or adjusted under 35 U.S.C. 154(b) by 765 days.

(21) Appl. No.: 17/418,075

(22) PCT Filed: Nov. 3, 2020

(86) PCT No.: PCT/CN2020/126270
§ 371 (c)(1),
(2) Date: Jun. 24, 2021

(87) PCT Pub. No.: WO2021/088832
PCT Pub. Date: May 14, 2021

(65) Prior Publication Data
US 2022/0077276 A1 Mar. 10, 2022

(30) Foreign Application Priority Data

Nov. 5, 2019 (CN) .......................... 201911070901.7

(51) Int. Cl.
*H01L 27/32* (2006.01)
*H01L 51/52* (2006.01)
(Continued)

(52) U.S. Cl.
CPC ......... *H10K 59/173* (2023.02); *H10K 50/813* (2023.02); *H10K 50/822* (2023.02);
(Continued)

(58) Field of Classification Search
CPC ..................... H10K 59/176; H10K 59/35–353
See application file for complete search history.

(56) References Cited

U.S. PATENT DOCUMENTS 10,283,578 B2   5/2019  Ka et al.
10,923,543 B1 * 2/2021  Chen ...................... H10K 71/00
(Continued)

FOREIGN PATENT DOCUMENTS

CN    109004106 A    12/2018
CN    109801950 A     5/2019
(Continued)

OTHER PUBLICATIONS

Machine translation, Chen, Chinese Pat. Pub. No. CN110265472A, translation date: Feb. 9, 2024, Espacenet, all pages. (Year: 2024).*
(Continued)

*Primary Examiner* — Victoria K. Hall
(74) *Attorney, Agent, or Firm* — Calfee, Halter & Griswold LLP

(57) ABSTRACT

A display apparatus, a display substrate and a manufacturing method therefor are provided. The display substrate comprises: a driving back plate, having a first driving area and a second driving area; a first electrode pattern, comprising a plurality of transparent first electrodes and a second electrode; a light emitting layer, comprising a first light emitting portion in the first driving area and a second light emitting portion in the second driving area; a second electrode pattern, comprising a plurality of transparent third electrodes in the first driving area and a fourth electrode located in the second driving area. The first electrode, the first light emit-
(Continued)

ting portion and the third electrode corresponding to the first driving area constitute a Passive matrix organic light-emitting diode structure.

19 Claims, 8 Drawing Sheets

(51) Int. Cl.
*H01L 51/56* (2006.01)
*H10K 50/813* (2023.01)
*H10K 50/822* (2023.01)
*H10K 59/121* (2023.01)
*H10K 59/17* (2023.01)
*H10K 59/173* (2023.01)
*H10K 59/179* (2023.01)
*H10K 59/35* (2023.01)
*H10K 71/00* (2023.01)
*H10K 59/131* (2023.01)
*H10K 59/65* (2023.01)

(52) U.S. Cl.
CPC .......... *H10K 59/121* (2023.02); *H10K 59/17* (2023.02); *H10K 59/179* (2023.02); *H10K 59/353* (2023.02); *H10K 71/00* (2023.02); *H10K 59/131* (2023.02); *H10K 59/352* (2023.02); *H10K 59/65* (2023.02)

(56) References Cited

U.S. PATENT DOCUMENTS

| | | | | |
|---|---|---|---|---|
| 2005/0093784 | A1* | 5/2005 | Sakurai | H10K 59/127 345/80 |
| 2015/0380470 | A1* | 12/2015 | Lee | H10K 59/351 257/40 |
| 2018/0069068 | A1 | 3/2018 | Ka et al. | |
| 2019/0006629 | A1* | 1/2019 | Wan | H10K 50/81 |
| 2019/0259823 | A1 | 8/2019 | Ka et al. | |
| 2020/0251539 | A1 | 8/2020 | Fu | |
| 2020/0350375 | A1 | 11/2020 | Zhu et al. | |
| 2020/0350377 | A1* | 11/2020 | Zhong | H10K 59/176 |
| 2021/0020706 | A1* | 1/2021 | Chen | H10K 59/17 |
| 2021/0358969 | A1* | 11/2021 | Wang | G09G 3/20 |
| 2023/0225170 | A1* | 7/2023 | Sun | H10K 59/352 257/40 |
| 2023/0255170 | A1* | 8/2023 | Erdahl | C12N 15/8274 800/312 |

FOREIGN PATENT DOCUMENTS

| | | | | |
|---|---|---|---|---|
| CN | 110061044 | A | | 7/2019 |
| CN | 110265472 | A * | 9/2019 | ......... H01L 27/1214 |
| CN | 110289300 | A | | 9/2019 |
| CN | 110767826 | A * | 2/2020 | ......... H10K 50/8428 |
| CN | 110783391 | A | | 2/2020 |
| EP | 3293766 | A1 | | 3/2018 |

OTHER PUBLICATIONS

Machine translation, Tang, Chinese Pat. Pub. No. CN110767826A, translation date: Feb. 9, 2024, Espacenet, all pages. (Year: 2024).*
Office Action from Chinese Application No. 201911070901.7 dated Aug. 11, 2021.
International Search Report and Written Opinion from PCT/CN2020/126270 dated Feb. 1, 2021.

* cited by examiner

ELECTRONIC DEVICE, DISPLAY APPARATUS, DISPLAY SUBSTRATE AND MANUFACTURING METHOD THEREFOR

CROSS-REFERENCE TO RELATED APPLICATIONS

This application is the national stage entry of PCT/CN2020/126270, filed on Nov. 3, 2020, which claims priority to Chinese Patent Application No. 201911070901.7 filed in China on Nov. 5, 2019, the entire contents of which are hereby incorporated by reference.

TECHNICAL FIELD

The present disclosure relates to the field of display, and in particular, to an electronic device, a display apparatus, a display substrate and a manufacturing method thereof.

BACKGROUND

In electronic devices such as mobile phones, tablets or the like, photosensitive elements such as cameras have become an essential part. Currently, in order to place the photosensitive element and avoid the display substrate of the electronic device from blocking the photosensitive element to receive light, it is necessary to open a hole for accommodating the photosensitive element in the display substrate. However, it will cause the opened area unable to set the display element, resulting in that the display substrate cannot display images in the opened area, so that the effective display area is low.

It should be noted that the information disclosed in the above BACKGROUND is only used to enhance the understanding of the background of the present disclosure, and therefore may include information that does not constitute the prior art known to those of ordinary skill in the art.

SUMMARY

It is an object of the present disclosure to overcome the shortcomings of the above prior art, and there is provided an electronic device, a display apparatus, a display substrate and a manufacturing method thereof.

According to one aspect of the present disclosure, there is provided a display substrate, including:
  a driving back plate, having a first driving area and a second driving area;
  a first electrode pattern, provided on a side of the driving back plate and including a plurality of transparent first electrodes located in the first driving area and a second electrode located in the second driving area, wherein the first electrode is in a strip shape extending in a first direction and spaced apart in a second direction;
  a light emitting layer, provided on a side of the first electrode pattern away from the driving back plate, and including a first light emitting portion located in the first driving area and a second light emitting portion located in the second driving area;
  a second electrode pattern, provided on a side of the light emitting layer away from the driving back plate, and including a plurality of transparent third electrodes located in the first driving area and a fourth electrode located in the second driving area, wherein the third electrode is in a strip shape extending in the second direction and spaced apart in the first direction,
wherein the first electrode and the second electrode are different, and the third electrode and the fourth electrode are different.

In an exemplary embodiment of the present disclosure, an angle between the first direction and the second direction is between 80 degrees to 100 degrees, the first electrode penetrates through the first driving area along the first direction, and the third electrode penetrates through the first driving area along the second direction.

In an exemplary embodiment of the present disclosure, the second electrode is a light shielding structure, and the fourth electrode is a transparent structure.

In an exemplary embodiment of the present disclosure, the second electrode includes a first transparent conductive layer, a metal layer and a second transparent conductive layer sequentially laminated in a direction away from the driving back plate;
  the fourth electrode includes a first conductive layer and a second conductive layer sequentially laminated in a direction away from the driving back plate.

In an exemplary embodiment of the present disclosure, material of the first electrode is the same as that of the first transparent conductive layer and the second transparent conductive layer of the second electrode; and material of the third electrode is the same as that of the second conductive layer of the fourth electrode.

In an exemplary embodiment of the present disclosure, the display substrate further includes:
  a pixel defining layer, located on a side of the first electrode pattern away from the driving back plate and including a first defining portion located in the first driving area and a second defining portion located in the second driving area, wherein the first defining portion has a plurality of first openings distributed in an array, the first opening exposes the first electrode, the first light emitting portion includes a plurality of first light emitting units corresponding to the plurality of first openings, each of the plurality of first light emitting units includes a portion located within the corresponding first opening; the second defining portion has a plurality of second openings distributed in an array, the second opening exposes the second electrode, the second light emitting portion includes a plurality of second light emitting units corresponding to the plurality of second openings, each of the plurality of second light emitting units includes a portion located within the corresponding second opening;
  a spacer layer, located on a side of the first defining portion away from the driving back plate, and including a plurality of strip-shaped isolation pillars extending along the second direction and spaced apart in the first direction, wherein the third electrode and an orthographic projection of the isolation pillar on the driving back plate are alternately distributed, and a film layer made of the same material as the third electrode is formed on a surface of the isolation pillar away from the driving back plate.

In an exemplary embodiment of the present disclosure, each of the first light emitting units is divided into a plurality of first light emitting unit groups, and the same first light emitting group includes three first light emitting units with different emission colors, the first light emitting units located in the same row in the first direction are directly opposite to the same first electrode, and the first light emitting units located in the same column in the second direction are directly opposite to the same third electrode, the first light emitting unit is able to emit light under driving of the first electrode and the third electrode directly opposite to the first light emitting unit; each of the second light emitting units is divided into a plurality of second light emitting unit groups, and the same second light emitting unit group includes four of the second light emitting units, each of the second light emitting units is directly opposite to each of the second electrodes one by one, and the fourth electrode is a common electrode, corresponding to all the second light emitting units, the second light emitting unit is able to emit light under driving of the second electrode and the fourth electrode directly opposite to the second light emitting unit; at most two of the second light emitting units in the same second light emitting unit group emit light in the same color.

In an exemplary embodiment of the present disclosure, the isolation pillar includes a first layer and a second layer sequentially laminated along a direction away from the driving back plate, and an orthographic projection of the first layer on the driving back plate is smaller than an orthographic projection of the second layer on the driving back plate.

In an exemplary embodiment of the present disclosure, a thickness of the first electrode is greater than that of the second electrode.

According to one aspect of the present disclosure, there is provided a method of manufacturing a display substrate, including:
    forming a driving back plate having a first driving area and a second driving area;
    forming a first electrode pattern on a side of the driving back plate, wherein the first electrode pattern includes a plurality of transparent first electrodes located in the first driving area and a second electrode located in the second driving area, the first electrode is in a strip shape and spaced apart in a second direction, and the first electrode is different from the second electrode;
    forming a light emitting layer on a side of the first electrode pattern away from the driving back plate, wherein the light emitting layer includes a first light emitting portion located in the first driving area and a second light emitting portion located in the second driving area;
    forming a second electrode pattern on a side of the light emitting layer away from the driving back plate, wherein the second electrode pattern includes a plurality of transparent third electrodes located in the first driving area and a fourth electrode located in the second driving area, and the third electrode is in a strip shape and spaced apart in a first direction, and the third electrode is different from the fourth electrode.

In an exemplary embodiment of the present disclosure, the forming a first electrode pattern on a side of the driving back plate includes:
    forming the first electrode in the first driving area;
    forming a first transparent conductive layer covering the first electrode and the second driving area of the driving back plate;
    forming a metal layer covering the first transparent conductive layer;
    forming a second transparent conductive layer covering the metal layer;
    removing the second transparent conductive layer, the metal layer and the first transparent conductive layer of the first driving area through a patterning process, to form a second electrode.

In an exemplary embodiment of the present disclosure, after forming the first electrode pattern and before forming the light emitting layer, the manufacturing method further includes:
    forming a pixel defining layer on a side of the first electrode pattern away from the driving back plate, wherein the pixel defining layer includes a first defining portion located in the first driving area and a second defining portion located in the second driving area, the first defining portion has a plurality of first openings distributed in an array, the first opening exposes the first electrode, the second defining portion has a plurality of second openings distributed in an array, and the second opening exposes the second electrode;
    forming a spacer layer on a side of the first defining portion away from the driving back plate, wherein the spacer layer includes a plurality of strip-shaped isolation pillars extending along the second direction and spaced apart in the first direction,
    wherein the first light emitting portion includes a plurality of first light emitting units corresponding to the plurality of first openings, each of the plurality of first light emitting units includes a portion located within the corresponding first opening; the second light emitting portion includes a plurality of second light emitting units corresponding to the plurality of second openings, each of the plurality of second light emitting units includes a portion located within the corresponding second opening.

In an exemplary embodiment of the present disclosure, the isolation pillar includes a first layer and a second layer sequentially laminated along a direction away from the driving back plate; the forming a spacer layer on a side of the first defining portion away from the driving back plate includes:
    forming a first spacer material layer on a side of the first defining portion away from the driving back plate;
    forming a second spacer material layer on a side of the first spacer material layer away from the driving back plate;
    etching the second spacer material layer and the first spacer material layer sequentially, to form the first layer and the second layer of each of the isolation pillars, wherein an orthographic projection of the first layer on the driving back plate is smaller than an orthographic projection of the second layer on the driving back plate.

In an exemplary embodiment of the present disclosure, the forming a second electrode pattern on a side of the light emitting layer away from the driving back plate includes:
    forming a first conductive layer covering the second light emitting portion and the second defining portion, and forming a second conductive material layer on a side of the first conductive layer away from the driving back plate;
    forming a third electrode and a second conductive layer by one patterning process, wherein the third electrode is provided on a side of the first light emitting portion away from the driving back plate, the third electrode and an orthographic projection of the isolation pillar on the driving back plate are alternately distributed, and a film layer made of the same material as the third electrode is formed on a surface of the isolation pillar away from the driving back plate, the second conductive layer is disposed on a surface of the first conductive layer away from the driving back plate.

According to one aspect of the present disclosure, there is provided a display apparatus, including the display substrate according to any one of the above.

According to one aspect of the present disclosure, there is provided an electronic device, including:
the display apparatus according to any one of the above; and
a photosensitive element, arranged on a side of the driving back plate away from the light emitting layer and directly opposite to the first driving area.

In the electronic device, display apparatus, display substrate and manufacturing method thereof of the present disclosure, the first electrode, the first light emitting portion and the third electrode corresponding to the first driving area can constitute a PMOLED (Passive Matrix OLED) structure. The photosensitive element may be directly opposite to the PMOLED structure. Since both the first electrode and the third electrode are transparent, the PMOLED structure is transparent, and the photosensitive element can also receive light without opening a hole. At the same time, since the PMOLED structure does not need to be driven by a thin film transistor array, circuits of the first driving area are simplified, occlusion to the light is reduced, so that the transmittance rate of the portion of the display substrate corresponding to the first driving area is improved, and the working effect of the photosensitive element is improved. Further, the second electrode, the second light emitting portion and the fourth electrode corresponding to the second driving area can also achieve an image. When being used, the portion corresponding to the second driving area always displays the image, the portion corresponding to the first driving area can turn off when the photosensitive element is working and display the image when the full screen display is needed. Thereby, the full screen display can be implemented without affecting the operation of the photosensitive element.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the disclosure, and explain the principle of the disclosure together with the specification. The drawings in the following description are only some embodiments of the present disclosure. For those of ordinary skill in the art, other drawings can be obtained based on these drawings without creative work.

REFERENCE NUMERALS

Figure 1:
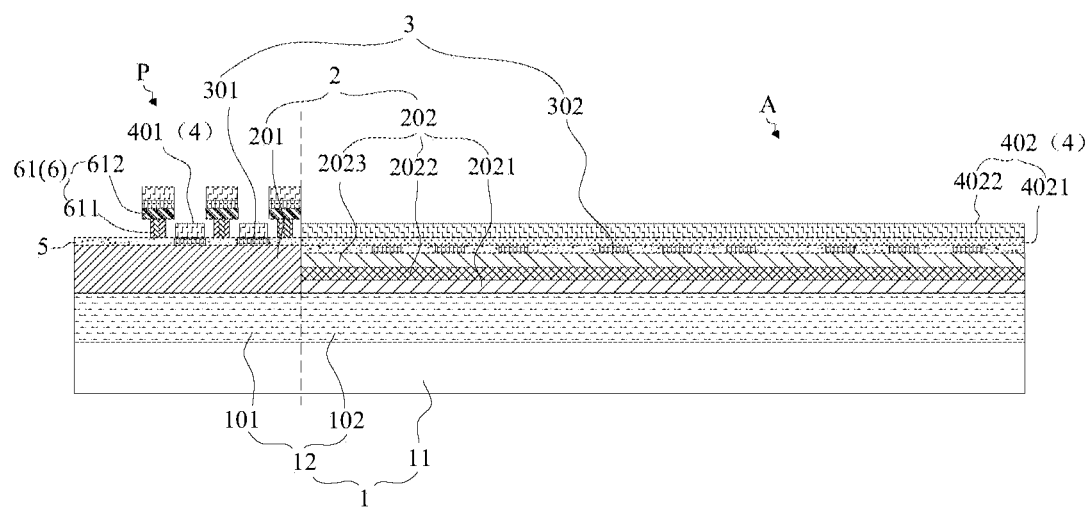
FIG. 1 is a schematic diagram of an embodiment of a display substrate of the present disclosure.

1, driving back plate; 11, substrate; 12, driving circuit layer; 101, first driving area; 102, second driving area; 2, first electrode pattern; 201, first electrode; 202, second electrode; 2021, first transparent conductive layer; 2022, metal layer; 2023, second transparent conductive layer; 3, light emitting layer; 301, first light emitting portion; 302, second light emitting portion; 4, second electrode pattern; 401, third electrode; 402, fourth electrode; 4021, first conductive layer; 4022, second conductive layer; 5, pixel defining layer; 6, spacer layer; 61, isolation pillar; 611, first layer; 612, second layer; 7, first driving circuit; 8, a second drive circuit; 100, display apparatus, 200, photosensitive element.

DETAILED DESCRIPTION

Example embodiments will now be described more fully with reference to the accompanying drawings. However, the example embodiments can be implemented in various forms, and should not be construed as being limited to the embodiments set forth herein; on the contrary, these embodiments are provided so that the present disclosure will be comprehensive and complete, and fully convey the concept of the example embodiments to those skilled in the art. The same reference numerals in the figures indicate the same or similar structures, and thus their detailed descriptions will be omitted. In addition, the drawings are only schematic illustrations of the present disclosure, and are not necessarily drawn to scale.

Although relative terms such as "upper", "below" are used in this specification to describe the relative relationship of one component of the icon with respect to another component, these terms are used in this specification only for convenience, such as according to the direction of the example described in the drawings. It will be appreciated that if the device of the icon is flipped to reverse it, the components described "upper" will become the "below" component. When a structure is "on" other structures, it may refer to that a structure is integrally formed on other structures, or the structure is "directly" disposed on other structures, or the structure is "indirectly" disposed on other structures through another structure.

The terms "a", "an", "the" and "said" are used to indicate the presence of one or more elements/components/etc.; the terms "including" and "having" are used to indicate open-ended inclusive meaning and mean that in addition to the listed elements/components/etc., there may be other elements/components/etc.; the terms "first", "second", "third" and "fourth" are only used as marks, not to limit the number of the objects.

Figure 2:
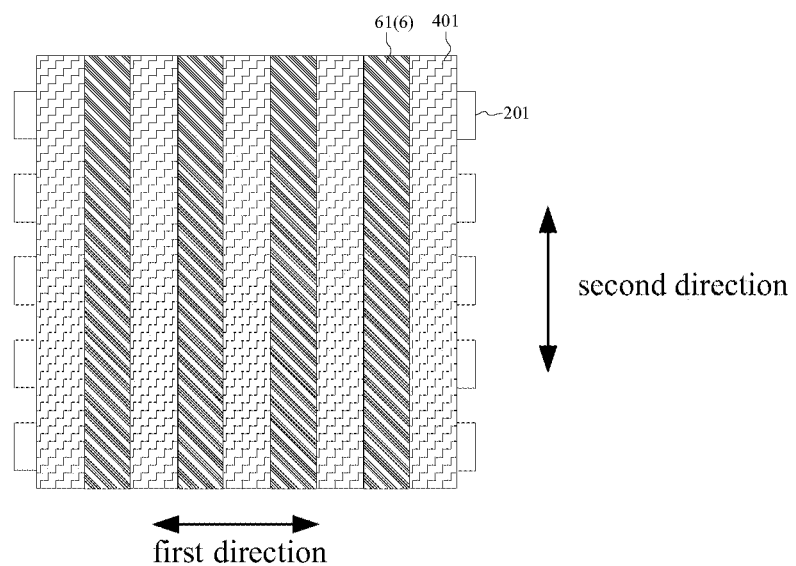
FIG. 2 is a plan view of a distribution manner of a first electrode and a third electrode in an embodiment of a display substrate of the present disclosure.
Figure 3:
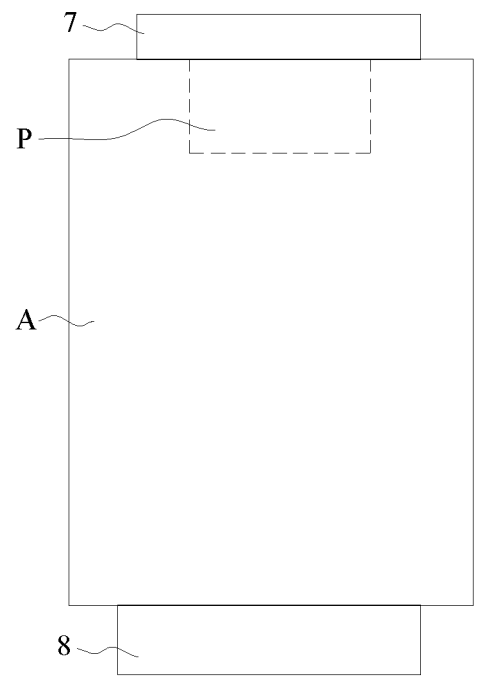
FIG. 3 is a plan view of an embodiment of a display substrate of the present disclosure.

The embodiments of the present disclosure provide a display substrate, as shown in FIGS. 1-3, the display substrate includes a driving back plate 1, a first electrode pattern 2, a light emitting layer 3 and a second electrode pattern 4.

The driving back plate 1 has a first driving area 101 and a second driving area 102.

The first electrode pattern 2 is provided on a side of the driving back plate 1 and includes a plurality of transparent first electrodes 201 located in the first driving area 101 and a second electrode 202 located in the second driving area 102, wherein the first electrode 201 is in a strip shape and spaced apart in a second direction.

The light emitting layer 3 is provided on a side of the first electrode pattern 2 away from the driving back plate 1, and includes a first light emitting portion 301 located in the first driving area 101 and a second light emitting portion 302 located in the second driving area 102.

The second electrode pattern 4 is provided on a side of the light emitting layer 3 away from the driving back plate 1, and includes a plurality of transparent third electrodes 401 located in the first driving area 101 and a fourth electrode 402 located in the second driving area 102, wherein the third electrode 401 is in a strip shape and spaced apart in the first direction.

In the display substrate of the present disclosure, the first electrode 201, the first light emitting portion 301 and the third electrode 401 corresponding to the first driving area 101 can constitute a PMOLED (Passive matrix organic light-emitting diode) structure. The photosensitive element may be directly opposite to the PMOLED structure. Since both the first electrode 201 and the third electrode 401 are transparent, the PMOLED structure is transparent, and the photosensitive element can also receive light without opening a hole. At the same time, since the PMOLED structure does not need to be driven by a thin film transistor array, circuits of the first driving area 101 are simplified, occlusion to the light is reduced, so that the transmittance rate of the portion of the display substrate corresponding to the first driving area 101 is improved, and the working effect of the photosensitive element is improved. Further, the second electrode 202, the second light emitting portion 302 and the fourth electrode 402 corresponding to the second driving area 102 can also achieve an image. When being used, the portion corresponding to the second driving area 102 always displays the image, the portion corresponding to the first driving area 101 can turn off when the photosensitive element is working and display the image when the full screen display is needed. Thereby, the full screen display can be implemented without affecting the operation of the photosensitive element.

It should be noted that an angle between the first direction and the second direction is between 80 degrees to 100 degrees. Preferably, the first direction is perpendicular to the second direction. In FIG. 2, the first direction is a row direction, and the second direction is column direction. However, it does not mean that the first direction must be a lateral direction, and the second direction must be a longitudinal in actual products.

Hereinafter, each part of the display substrate of the embodiment of the present disclosure will be described in detail.

The portion of the display substrate corresponding to the first driving area 101 may be defined as a P area, and the portion corresponding to the second driving area 102 may be defined as an A area.

As shown in FIGS. 1 and 3, the driving back plate 1 is at least divided into the first driving area 101 and the second driving area 102. The first driving area 101 can be used to drive the PMOLED structure to emit light, and the second driving area 102 can be used to drive the AMOLED (Active-matrix organic light-emitting diode) structure to emit light, or it can be used to drive the PMOLED structure to emit light, which depends on that the light emitting structure consisted by the second electrode 202, the second light emitting portion 302 and the fourth electrode 402 is an AMOLED light emitting structure or a PMOLED light emitting structure. If the PMOLED structure is driven to emit light, the structure of the driving area mainly includes data lines, power lines, and the like, and may also include some TFT structures, or the like. As a whole, compared with the AMOLED driving area structure, the back plate structure is simpler, the light shielding pattern is less, to facilitate improving the transmittance rate of the area. If the AMOLED structure is driven to emit light, the structure of the driving area mainly includes data lines, power lines, and TFTs whose number is more than the TFTs of the driving area of PMOLED, capacitors and other components, and gate lines, reference voltage lines, reset control lines, light emitting control lines, etc., to achieve higher display quality.

The first driving area 101 is directly opposite to the photosensitive element, as long as light required by the photosensitive element can pass through, therefore, in some embodiments of the present disclosure, the range of the first driving area 101 can be smaller than that of the second driving area 102, and it can be located at a part of the edge of the driving back plate 1, or can also be surrounded by the second driving area 102. For example, the driving back plate 1 is a rectangular area, including long sides and short sides. The first driving area 101 can be disposed at the edge of a short side of the driving back plate 1, and can be located at the edge portion of the entire short side of the driving back plate 1, arranged in parallel with the second driving area 102 along the long side direction. The first driving area 101 can also be provided at a portion of a short side edge of the driving back plate 1, for example, at the middle of the edge portion of the short side, to form a water droplet type or a rectangle having a length less than a short side length of the driving back plate 1. The second driving area 102 presents a concaved pattern to surround the first driving area 101, such that the first driving area 101 and the second driving area 102 jointly constitute a rectangular area of the driving back plate 1.

In some embodiments of the present disclosure, as shown in FIG. 1, the driving back plate 1 can include a substrate 11 and a driving circuit layer 12. The substrate 11 can be flexible or hard material, such as PI (polyimide), PET (polyethylene terephthalate) or glass, which is not specified herein. The driving circuit layer 12 includes a first driving area 101 located in the P area and a second driving area 102 located in the A area.

As shown in FIG. 1, the first electrode pattern 2 is provided on a side of the driving back plate 1. For example, the first electrode pattern 2 is provided on a side of the driving circuit layer 12 away from the substrate 11. The first electrode pattern 2 can include a first electrode 201 and a second electrode 202.

There are a plurality of first electrodes 201, and they are located in the first driving area 101. That is, the projection of the first electrode 201 on the driving back plate 1 is located in the first driving area 101. At the same time, each of the first electrodes 201 is in a strip shape, and spaced apart along the second direction. The first electrode 201 can extend along the first direction. The second direction may be a direction perpendicular to the extending direction of the first electrode 201. The first electrode 201 can penetrate through the first driving area 101 in the first direction. That is, two ends of the first electrode 201 extend to the edge of the first driving area 101. Further, the first electrode 201 is a transparent structure. For example, the material of the first electrode 201 is transparent conductive material such as ITO (indium tin oxide) or IZO (indium zinc oxide) or the like. The first electrode 201 can be used as an anode of the PMOLED structure.

The second electrode 202 is located in the second driving area 102, i.e., the projection of the second electrode 202 on the driving back plate 1 is located in the second driving area 102, which is different from the pattern of the first electrode 201. If the second driving area 102 is a circuit for driving the AMOLED structure, the second electrode 202 can act as an anode of the AMOLED structure, and the number is plural, and distributed in an array.

The second electrode 202 may be a light shielding structure. In some embodiments of the present disclosure, as shown in FIG. 1, the second electrode 202 can include a first transparent conductive layer 2021, a metal layer 2022 and a second transparent conductive layer 2023 sequentially laminated in a direction away from the driving back plate 1. The first transparent conductive layer 2021 and the second transparent conductive layer 2023 can both use transparent conductive material such as ITO (indium tin oxide) or IZO (indium zinc oxide) or the like, but the material of them may be different. The material of the metal layer 2022 may be Mg, Ag or other light shielding metals. The second electrode 202 can also be a single layer metal structure.

In some embodiments of the present disclosure, the first electrode 201, the first light emitting portion 301 and the third electrode 401 may constitute the PMOLED structure, and the second electrode 202, the second light emitting portion 302 and the fourth electrode 402 can constitute the AMOLED structure. In order to reduce the square resistance of the first electrode 201, the thickness of the first electrode 201 may be larger than that of the second electrode 202, to improve the conductive property. The thickness direction refers to the direction perpendicular to the back plate.

As shown in FIG. 1, the light emitting layer 3 may be an OLED light emitting structure, which is located on a side of the first electrode pattern 2 away from the driving back plate 1. It may include a hole injection layer, a hole transport layer, a light emitting functional layer, an electron injection layer and an electron transport layer or the like in the direction perpendicular to the driving back plate 1.

In the direction parallel to the driving back plate 1, the light emitting layer 3 can include a first light generating portion 301 and a second light emitting portion 302.

The first light emitting portion 301 is located in the first driving area 101, i.e., located on the side of the first electrode 201 away from the driving back plate 1. The first light emitting portion 301 can include a plurality of first light emitting units distributed in an array. The first light emitting unit can be divided into a plurality of first light emitting unit groups, each of which includes a plurality of adjacent first light emitting units. Each of the first light emitting groups is distributed in an array, and the same first light emitting unit group includes first light emitting units of at least three colors. In some embodiments of the present disclosure, in the same first light emitting unit group, the number of first light emitting units can be three, and the color includes red (R), green (G), and blue (B).

Figure 4:
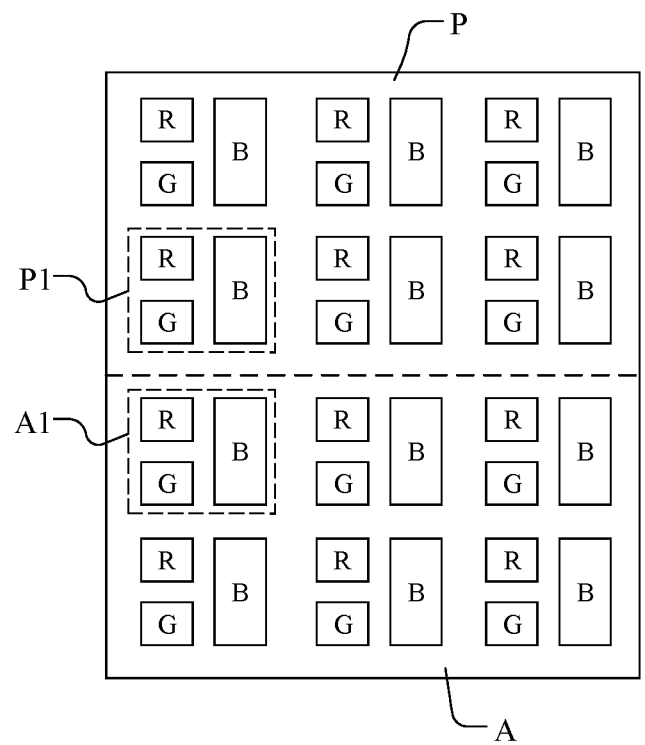
FIG. 4 is a partial schematic view of a pixel distribution manner in an embodiment of a display substrate of the present disclosure.
Figure 5:
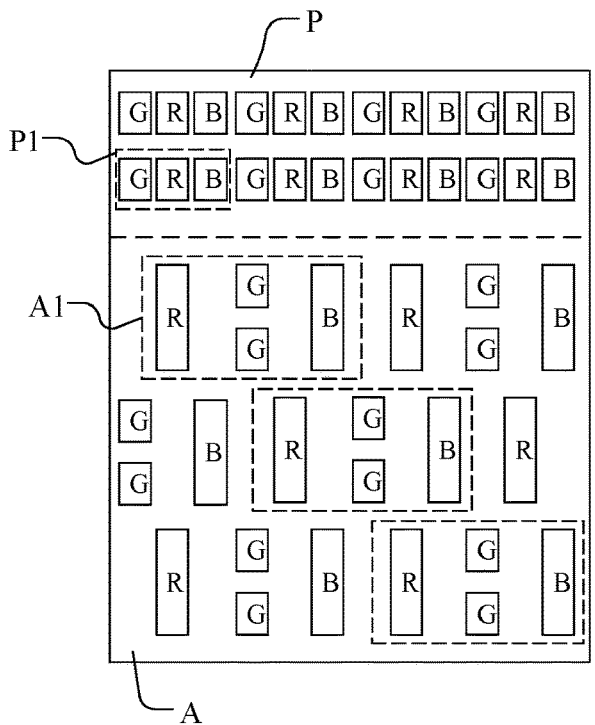
FIG. 5 is a partial schematic view of a pixel distribution manner in another embodiment of a display substrate of the present disclosure.

In the P area of the display substrate, each of the first light emitting units corresponds to a first sub-pixel. Each of the first light emitting unit groups corresponds to a first pixel P1. The red first light emitting unit corresponds to the first sub-pixel emitting the red light, i.e., the R sub-pixel. The green light emitting unit corresponds to the first sub-pixel emitting the green light, i.e., the G sub-pixel. The blue first light emitting unit corresponds to the first sub-pixel emitting the blue light, i.e., the B sub-pixel. The distribution manner of each first sub-pixel in the P area is the same as the distribution manner of the first light emitting unit. As shown in FIG. 4, in some embodiments of the present disclosure, each of the first pixels P1 of the P area is distributed in a plurality of rows and a plurality of columns in an array, and the first sub-pixels are distributed in the first distribution manner, in which, in the same first pixel P1, the red first sub-pixel R and the green first sub-pixel G are located in the same column, the blue first sub-pixel B is located in a column adjacent to the red first sub-pixel R and the green first sub-pixel G, and the area of each of the red first sub-pixel R and green first sub-pixel G is smaller than the area of the blue first sub-pixel B. As shown in FIG. 5, the first sub-pixels can also be distributed in the second distribution manner, in which, each first sub-pixel of the same first pixel can also be located in the same column or the same row. Other distribution manners can also be used, and the distribution manner is not specifically limited herein.

Further, in some embodiments of the present disclosure, the first light emitting units in the same row or the same column may also be areas where the same continuous light emitting modules respectively overlap with the first electrode 201 in space.

The second light emitting portion 302 is located in the second driving area 102, i.e., on the side of the second electrode 202 away from the driving back plate 1. The AMOLED structure is taken as an example, the second light emitting portion 302 includes a plurality of second light emitting unit groups distributed in an array, and each second light emitting unit group includes second light emitting units of at least three colors, including red (R), green (G), and blue (B).

In the A area of the display substrate, each second light emitting unit corresponds to a second sub-pixel, and each second light emitting unit group corresponds to a second pixel A1. The red second light emitting unit corresponds to the second sub-pixel that emits red light, i.e., the R sub-pixel. The green light emitting unit corresponds to the second sub-pixel that emits green light, i.e., the G sub-pixel. The blue second light emitting unit corresponds to the second sub-pixel that emits blue light, i.e., the B sub-pixel. The distribution manner of the second sub-pixels in the A area is the same as the distribution manner of the second light emitting unit.

As shown in FIG. 5, in some embodiments of the present disclosure, each second pixel A1 of the A area is distributed in a plurality of rows and a plurality of columns in an array, and the second sub-pixels can be distributed in a third distribution manner, in which, each second pixel A1 includes a red second sub-pixel R, two green second sub-pixels G, and a blue second sub-pixel B. In the same second pixel A1, the two green second sub-pixels G are located in the same column, and located between the blue second sub-pixel B and the red second sub-pixel R, and the area of each of the red second sub-pixel R and the blue second sub-pixel B is larger than the area of the green second sub-pixel G. The second pixels A1 in two adjacent rows are staggered in the first direction. That is, in the second pixels A1 in two adjacent rows, the red second sub-pixel R in the second pixel A1 in one row is directly opposite to the gap between the green second sub-pixel G and the blue second sub-pixel B in another row, the green second sub-pixel G in the second pixel A1 in one row is directly opposite to the gap between the red second sub-pixel R and the blue second sub-pixel B in another row, and the blue second sub-pixel B in the second pixel A1 in one row is directly opposite to the gap of the red second sub-pixel R and green second sub-pixel G in another row.

As shown in FIG. 4, the second sub-pixels can also be distributed in the first distribution manner of the first sub-pixels, which will not be described in detail herein. In addition, the second sub-pixels of the same second pixel can be located in the same column or the same row, and two green sub-pixels are arranged adjacent to each other. Other distribution manners can also be used, which is not specifically limited herein.

Further, in an embodiment of the present disclosure, as shown in FIG. 5, the first sub-pixels are distributed using the above-mentioned second distribution manner, and the second sub-pixels in the A area are distributed using the above-mentioned first distribution manner. The colors of the first sub-pixel and the second sub-pixel in the same column can be the same, so that when the first light emitting unit and the second light emitting unit of the light emitting layer 3 are evaporated, the process difficulty of the mask is reduced, and the error of the pattern of the mask is reduced.

It should be noted that the above-mentioned first to third distribution manners and their combination relationship are only exemplary descriptions, and are not limited to the distribution manners and the combination relationship of the distribution manners shown in FIG. 4 and FIG. 5. At the same time, the shapes of the first sub-pixel and the second sub-pixel are not limited to the shapes shown in FIGS. 4 and 5, and the shapes of the first sub-pixels of different colors can be different, and the colors of the second sub-pixels of different colors can also be different.

As shown in FIG. 1, the second electrode pattern 4 is provided on a side of the light emitting layer 3 away from the driving back plate 1, and includes a third electrode 401 and a fourth electrode 402.

In the embodiment, the third electrode 401 is located in the first driving area 101, i.e., on the side of the first light emitting portion 301 away from the driving back plate 1. The third electrode 401 has a transparent structure. For example, the material of the third electrode 401 is transparent conductive material such as ITO (Indium Tin Oxide) or IZO (Indium Zinc Oxide) or the like, but it may be different from the material of the first electrode 201. The third electrode 401 can be used as a cathode of the PMOLED structure.

In some embodiments of the present disclosure, as shown in FIG. 2, the number of the third electrodes 401 is multiple, and the third electrodes 401 are in a strip shape and spaced apart along the first direction. Each third electrode 401 extends linearly along the second direction. Since the first direction and the second direction are different directions, the third electrode 401 and the first electrode 201 are crisscrossed in space. For example, the third electrode 401 may extend linearly along the second direction, and the first direction may be a direction perpendicular to the extending direction of the third electrode 401, that is, the first direction may be perpendicular to the second direction. Alternatively, in other embodiments of the present disclosure, the number of the third electrodes 401 is multiple, and they are distributed in an array on the side of the first light emitting portion 301 away from the driving back plate 1, and the third electrodes 401 in the same column may be connected by a wire. The third electrode 401 has a transparent structure. For example, its material is transparent conductive material such as ITO (Indium Tin Oxide) or IZO (Indium Zinc Oxide) or the like.

As shown in FIG. 1, the fourth electrode 402 is located in the second driving area 102, i.e., on the side of the second light emitting portion 302 away from the driving back plate 1, and is intermittently arranged with the third electrode 401, so as to form an OLED structure with the second light emitting portion 302 and second electrode 202. The fourth electrode 402 can serve as a cathode, and the second driving area 102 can drive the OLED structure to emit light. At the same time, the fourth electrode 402 has a transparent structure, so as to form a top-emitting OLED. Taking the OLED structure as an AMOLED structure as an example, the fourth electrode 402 covers the entire second light emitting portion 302. The above AMOLED structure can also be replaced with a PMOLED structure, as long as it can display images.

In some embodiments of the present disclosure, the fourth electrode 402 includes a first conductive layer 4021 and a second conductive layer 4022 that are sequentially stacked in a direction away from the driving back plate 1. Both the first conductive layer 4021 and the second conductive layer 4022 are transparent structures. The material of the first conductive layer 4021 may be metal material such as Mg (magnesium) or Ag (silver). The material and thickness of the second conductive layer 4022 can be the same as those of the third electrode 401, so as to be formed by one patterning process with the third electrode 401, to reduce the resistance of the fourth electrode 402, but the second conductive layer 4022 and the third electrode 401 are intermittently arranged.

When the material of the third electrode 401 is transparent conductive material such as ITO or IZO, and the material of the first conductive layer 4021 can be metal material such as Mg or Ag, the transmittance rate of the third electrode 401 is greater than that of the fourth electrode 402, which can increase the transmittance rate of the P area and facilitate the photosensitive element to receive light. The fourth electrode 402 may also have a single-layer structure.

In addition, the display substrate of the embodiment of the present disclosure may further include a pixel defining layer 5 and a spacer layer 6.

In the embodiment, the pixel defining layer 5 may cover on a side of the first electrode pattern 2 away from the driving back plate 1. The pixel defining layer 5 may include a first defining portion and a second defining portion, and the first defining portion is located in the first driving area 101, the second defining portion is located in the second driving area 102. The first defining portion has a plurality of first openings distributed in an array exposing the first electrode 201, and the second defining portion has a plurality of second openings distributed in an array exposing the second electrode 202. The first light emitting unit described above can correspond to each first opening one by one, and at least a part of each of the first light emitting units is filled in the first opening. Each second light emitting unit can correspond to each second opening one by one, and at least a part of each second light emitting unit is filled in the corresponding second opening. The parts of the first electrode 201, the first light emitting unit and the third electrode 401 corresponding to the same first opening can be used to form a first sub-pixel, and the parts of the second electrode 202, the second light emitting unit and the fourth electrode 402 corresponding to the same second opening can be used to form a second sub-pixel.

The spacer layer 6 may be provided on the side of the first defining portion away from the driving back plate 1, and the spacer layer 6 may include a plurality of strip-shaped isolation pillars 61, and each isolation pillar 61 can be spaced apart along the above-mentioned first direction, and extend linearly along the second direction, so as to crisscross with the first electrode 201 in space. The first light emitting portion 301 may be located in the area where the first electrode 201 is exposed by the isolation pillar 61, and it may further cover the surface of the isolation pillar 61 away from the driving back plate 1, so that the first light emitting portion 301 can be separated by the isolation pillar 61, and each column of the first light emitting units and the isolation pillar 61 are alternately distributed along the first direction. At the same time, the projections of each third electrode 401 and each isolation pillar 61 on the driving back plate 1 are alternately distributed, so that the third electrodes 401 can be separated by the isolation pillars 61. During manufacturing, after the spacer layer 6 is formed, the light emitting layer 3 and the second electrode pattern 4 can be sequentially formed, and the first light emitting portion 301 and the third electrode 401 are defined by the isolation pillar 61.

When the third electrode 401 is formed, the material of the third electrode 401 can be formed directly on the side of the spacer layer 6 away from the driving back plate 1, and the part deposited between the isolation pillars 61 constitutes the third electrode 401. A film layer made of the same material as the third electrode 401 will also be formed on the surface of the isolation pillar 61 away from the driving the back plate 1, and the sidewall of the isolation pillar 61 will not be covered, so that the film layer is disconnected from the third electrode 401. In the same way, a film layer made of the same material as the first light emitting portion 301 is also formed on the surface of the isolation pillar 61 away from the driving back plate 1.

In addition, the edge of an isolation pillar 61 can be flush with the boundary line of the P area and the A area. When the second conductive layer 4022 of the fourth electrode 402 and the third electrode 401 are formed by one patterning process, the third electrode 401 and the second conductive layer 4022 may be disconnected due to the height difference formed by the isolation pillar 61, so that the third electrode 401 and the fourth electrode 402 can be independently controlled.

In some embodiments of the present disclosure, in order to prevent the light emitting layer 3 and the second electrode pattern 4 from being continuous at the sidewall of the isolation pillar 61 to cause crosstalk between two adjacent light emitting units, as shown in FIG. 1, the projection of one end of the isolation pillar 61 close to the driving back plate 1 on the driving back plate 1 may be smaller than the projection of one end of the isolation pillar 61 away from the driving back plate 1 on the driving back plate 1. For example, the cross section of the isolation pillar 61 may be an inverted trapezoid structure that shrinks toward the driving back plate 1. Alternatively, the two sidewalls of the isolation pillar 61 may also be recessed inward, as long as the light emitting layer 3 and the second electrode pattern 4 can be disconnected.

In some embodiments of the present disclosure, as shown in FIG. 1, the isolation pillar 61 may include a first layer 611 and a second layer 612 that are sequentially stacked in a direction away from the driving back plate 1. The projection of the first layer 611 on the driving back plate 1 is smaller than the projection of the second layer 612 on the driving back plate 1, so that the two sidewalls of the isolation pillar 61 are recessed inward, and the light emitting layer 3 and the second electrode pattern 4 are disconnected at the sidewall of the isolation pillar 61. At the same time, the material of the first layer 611 and the second layer 612 is different, and their etching rates for the same etchant are different. The etching rate for the first layer 611 is greater than the etching rate for the second layer 612, so that the first layer 611 and the second layer 612 may be formed by using different etching rates. For example, the material of the first layer 611 may be silicon nitride ($SiN_x$), and the material of the second layer 612 may be silicon oxide ($SiO_x$), and it may also be other material that meets the above requirements.

As shown in FIG. 3, the display substrate of the embodiment of the present disclosure may further include a first driving circuit 7 and a second driving circuit 8. The first driving circuit 7 may be bound to the first driving area 101, for driving the P area to display images or turn off, and the second driving circuit 8 can be bound to the second driving area 102 for driving the A area to display images or turn off.

The driving method of the display substrate will be exemplified below:

during the full-screen display period, the first driving circuit 7 drives the P area to display images, and the second driving circuit 8 drives the A area to display images;

during the shooting period, the first driving circuit 7 drives the P area to turn off, and the second driving circuit 8 drives the A area to display images.

Figure 6:
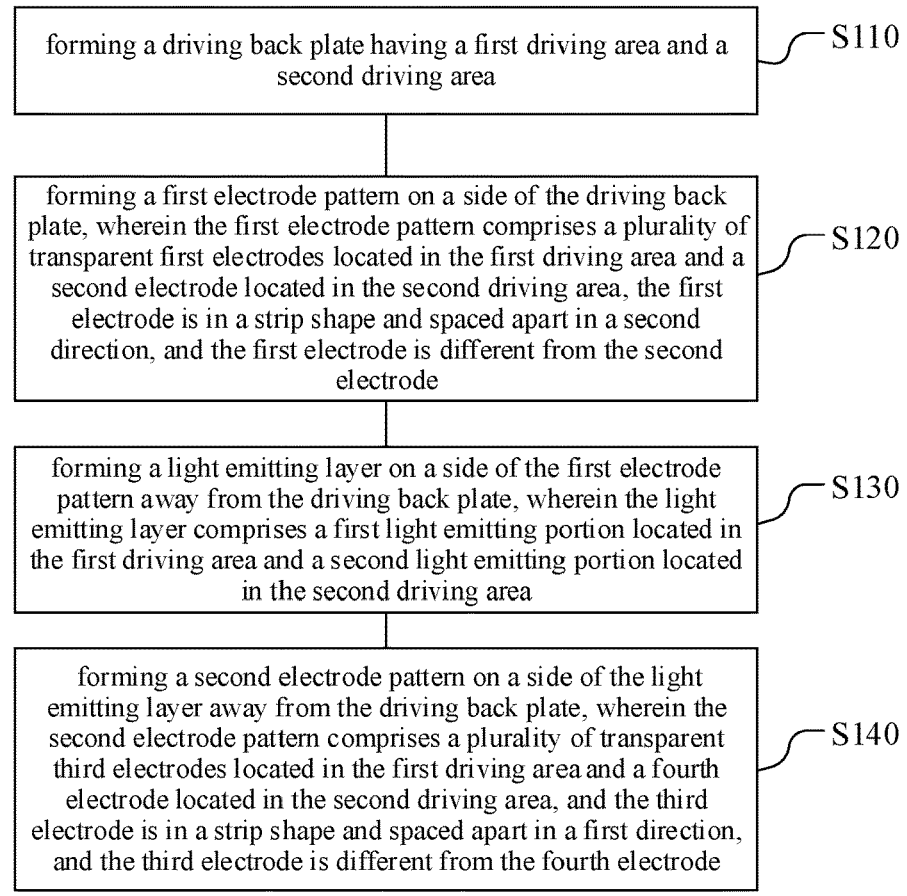
FIG. 6 is a flowchart of an embodiment of a method of manufacturing a display substrate of the present disclosure.

The embodiments of the present disclosure provide a method for manufacturing a display substrate. The display substrate may be the display substrate of any of the above-mentioned embodiments, and the specific structure thereof will not be repeated herein. As shown in FIG. 6, the manufacturing method includes step S110-step S140, wherein:

step S110, forming a driving back plate having a first driving area and a second driving area;

step S120, forming a first electrode pattern on a side of the driving back plate, wherein the first electrode pattern includes a plurality of transparent first electrodes located in the first driving area and a second electrode located in the second driving area, the first electrode is in a strip shape and spaced apart in a second direction;

step S130, forming a light emitting layer on a side of the first electrode pattern away from the driving back plate, wherein the light emitting layer includes a first light emitting portion located in the first driving area and a second light emitting portion located in the second driving area;

step S140, forming a second electrode pattern on a side of the light emitting layer away from the driving back plate, wherein the second electrode pattern includes a plurality of transparent third electrodes located in the first driving area and a fourth electrode located in the second driving area, and the third electrode is in a strip shape and spaced apart in a first direction, and the third electrode is different from the fourth electrode.

For the beneficial effects of the manufacturing method of the embodiments of the present disclosure, reference may be made to the beneficial effects of the above-mentioned display substrate, which will not be repeated herein.

The steps of the manufacturing method of the embodiment of the present disclosure are described below.

In step S110, the structure of the driving back plate 1 can refer to the description of the driving back plate 1 in the above display substrate embodiments, which will not be described in detail herein. For example, the driving circuit layer 12 may be formed on a substrate 11, and further planarization may be performed. The structure of the driving circuit layer 12 is not specifically limited herein.

Figure 7:
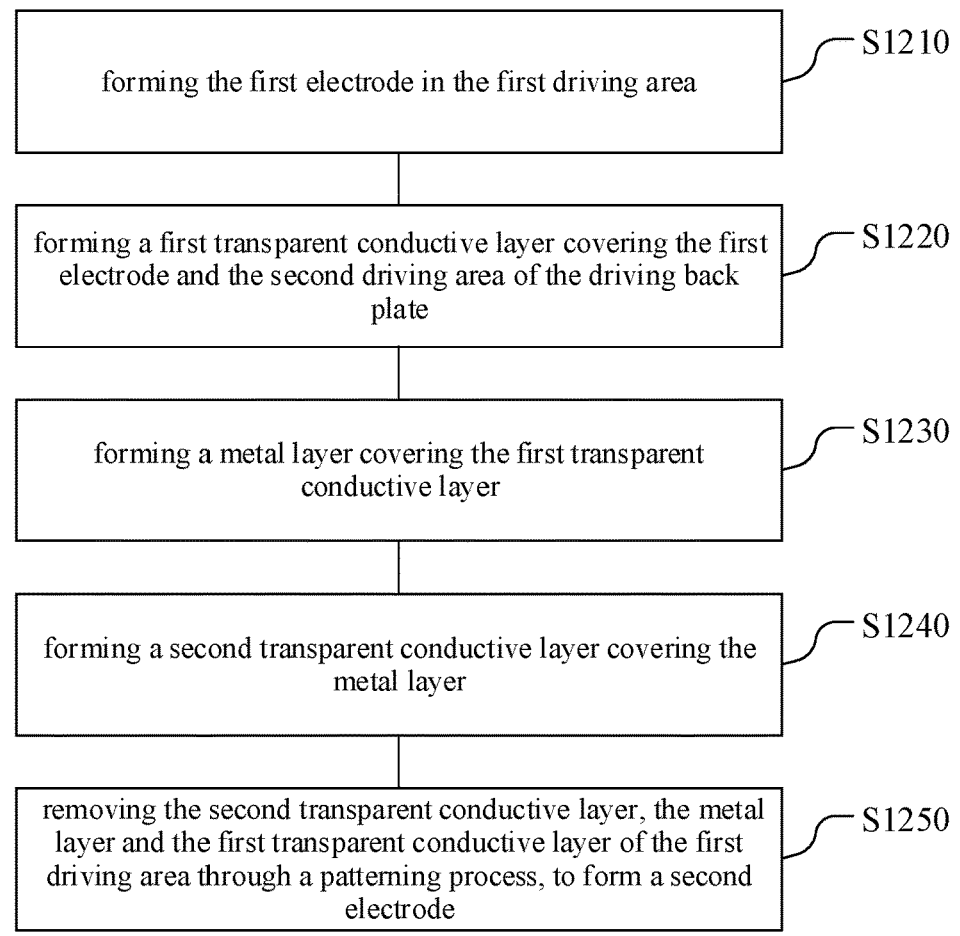
FIG. 7 is a flowchart of step S120 in an embodiment of a method of manufacturing a display substrate of the present disclosure.

In step S120, the structure of the first electrode pattern 2 can refer to the description of the first electrode pattern 2 in the above display substrate embodiments, which will not be repeated herein. In some embodiments of the present disclosure, the first electrode 201 is transparent material, and the second electrode 202 includes a first transparent conductive layer 2021, a metal layer 2022 and a second transparent conductive layer 2023 that are sequentially stacked in a direction away from the driving back plate 1. Correspondingly, as shown in FIG. 7, step S120 may include step S1210-step S1250.

Step S1210, the first electrode is formed in the first driving area.

The first electrode 201 may be formed by a photolithography process, which may include forming a film layer of the material of the first electrode 201, coating photoresist, exposure, development, and etching, etc., which will not be described in detail herein. Other patterning techniques can also be used.

Step S1220, a first transparent conductive layer covering the first electrode and the second driving area of the driving back plate is formed.

S1230, a metal layer covering the first transparent conductive layer is formed.

S1240, a second transparent conductive layer covering the metal layer is formed.

S1250, the second transparent conductive layer, the metal layer and the first transparent conductive layer of the first driving area are removed through a patterning process, to form a second electrode.

Figure 8:
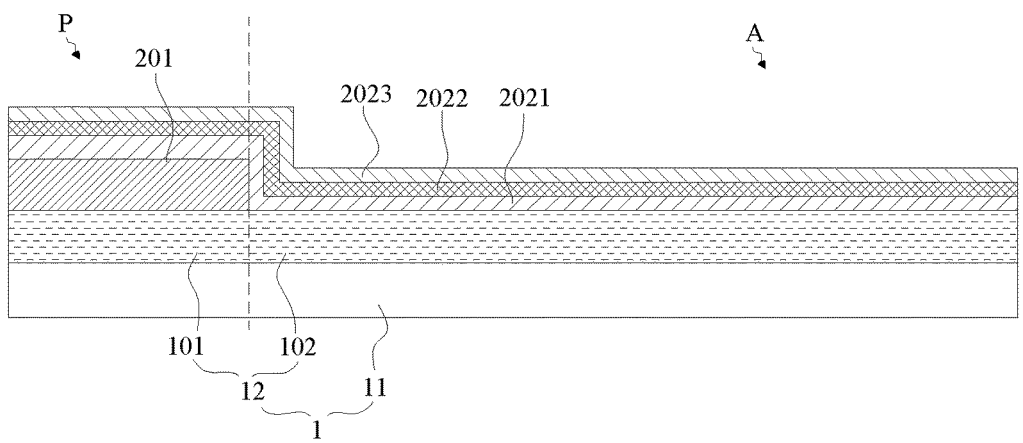
FIG. 8 is a structural schematic diagram corresponding to step S1240 in FIG. 7.
Figure 9:
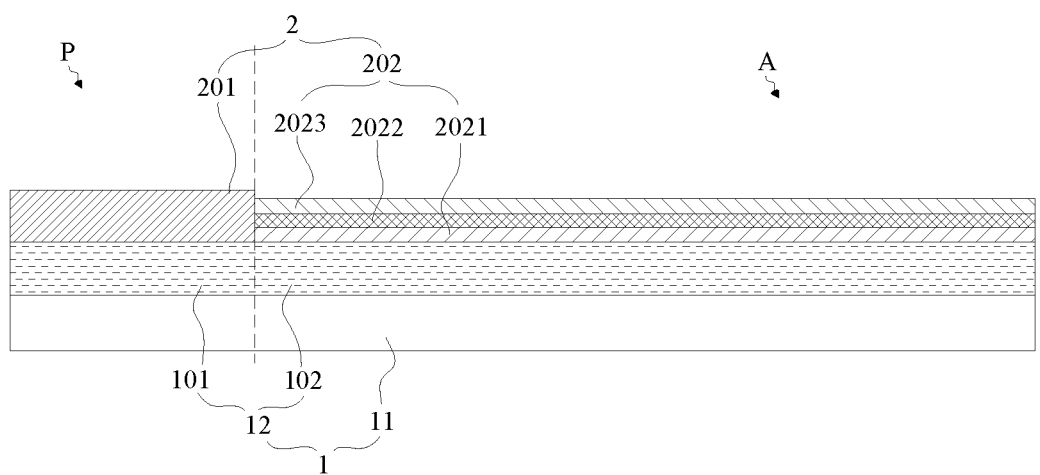
FIG. 9 is a structural schematic diagram corresponding to step S1250 in FIG. 7.

As shown in FIGS. 8 and 9, the specific structures of the first transparent conductive layer 2021, the metal layer 2022, and the second transparent conductive layer 2023 can refer to the second electrode 202 described above, which will not be repeated herein. Before the second electrode 202 is formed, the first electrode 201 can be covered with photoresist to avoid damage to it. The first transparent conductive layer 2021, the metal layer 2022, and the second transparent conductive layer 2023 can also be sequentially formed through multiple patterning processes.

In other embodiments of the present disclosure, the first electrode 201, the first transparent conductive layer 2021 and the second transparent conductive layer 2023 can adopt the same material. The first electrode 201 can be divided into two layers, and one layer of the first electrode 201 and the first transparent conductive layer 2021 can be formed at the same time. After the metal layer 2022 is formed on the side of the first transparent conductive layer 2021 away from the driving back plate 1, the other layer of the first electrode 201 and the second transparent conductive layer 2023 can be formed at the same time.

Figure 10:
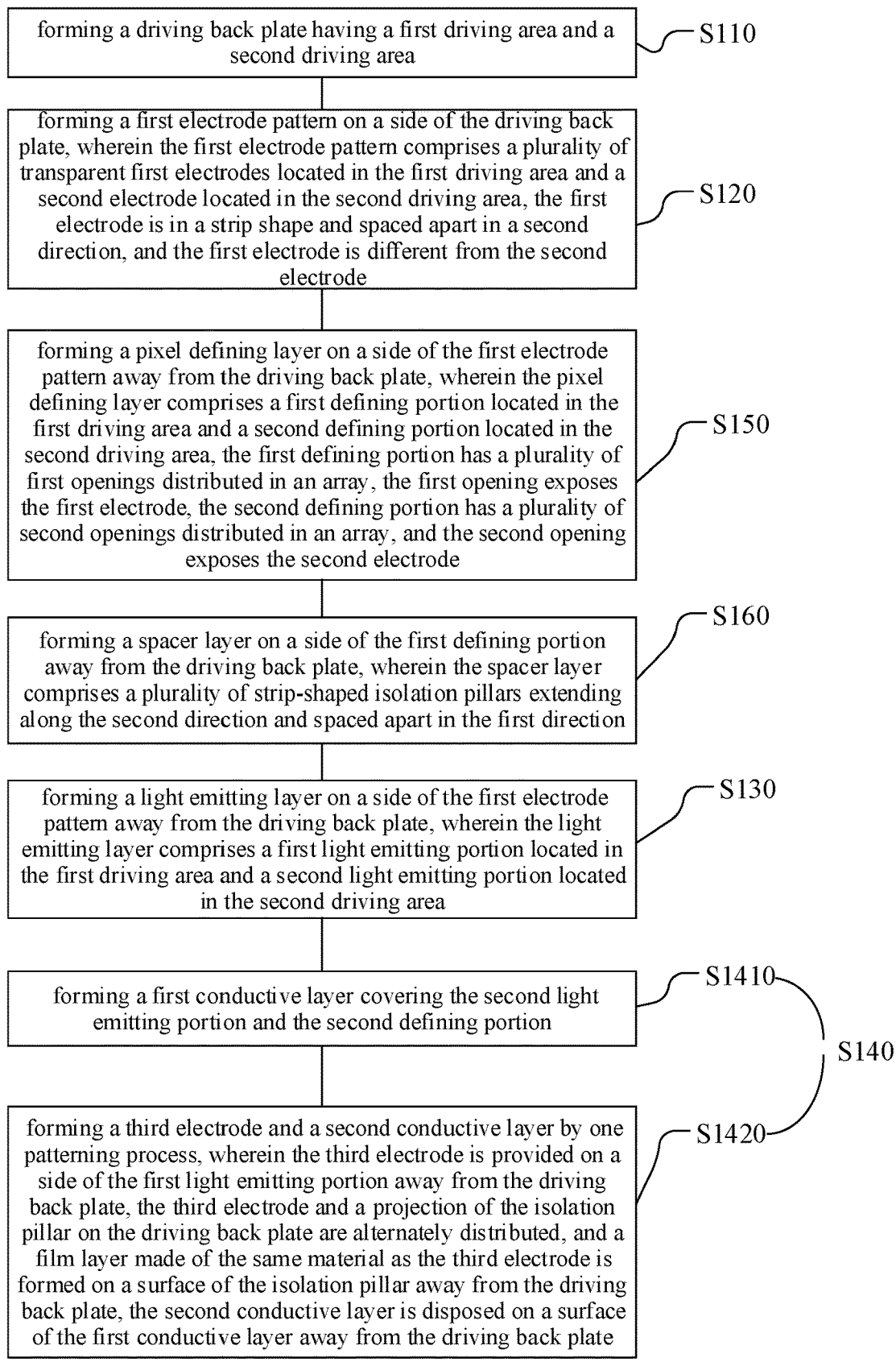
FIG. 10 is a flowchart of another embodiment of a method of manufacturing a substrate of the present disclosure.

In step S130, the structure of the light emitting layer 3 can refer to the description of the light emitting layer 3 in the above display substrate embodiments, which will not be repeated herein. In order to facilitate defining the pattern of the light emitting layer 3, in some embodiments of the present disclosure, as shown in FIG. 10, after step S120 and before step S130, the manufacturing method of the present disclosure further includes step S150 and step S160.

Step S150, a pixel defining layer is formed on a side of the first electrode pattern away from the driving back plate, wherein the pixel defining layer includes a first defining portion located in the first driving area and a second defining portion located in the second driving area, the first defining portion has a plurality of first openings distributed in an array, the first opening exposes the first electrode, the second defining portion has a plurality of second openings distributed in an array, and the second opening exposes the second electrode.

The structure of the pixel defining layer 5 can refer to the pixel defining layer 5 in the above display substrate embodiments, which will not be described in detail herein. The first defining portion has a plurality of first openings distributed in an array exposing the first electrode, and the second defining portion has a plurality of second openings distributed in an array exposing the second electrode. The first light emitting units may correspond to each first opening one by one, and at least a part of each first light emitting unit is filled in the first opening. Each second light emitting unit can correspond to each second opening one by one, and at least a part of each second light emitting unit is filled in the corresponding second opening. The parts of the first electrode 201, the first light emitting unit and the third electrode 401 corresponding to the same first opening can be used to form a first sub-pixel, and the parts of the second electrode 202, the second light emitting unit and the fourth electrode 402 corresponding to the same second opening can be used to form a second sub-pixel.

Step S160, a spacer layer is formed on a side of the first defining portion away from the driving back plate, wherein the spacer layer includes a plurality of strip-shaped isolation pillars extending along the second direction and spaced apart in the first direction.

Figure 11:
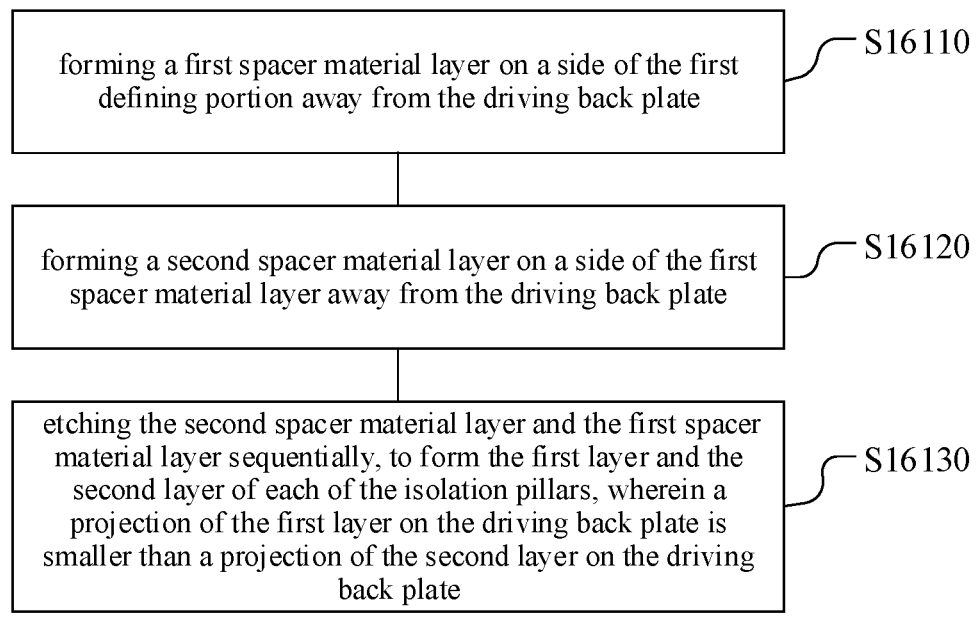
FIG. 11 is a flowchart of step S160 in FIG. 10.

The structure of the spacer layer 6 can refer to the spacer layer 6 in the above display substrate embodiments, which will not be repeated herein. In some embodiments of the present disclosure, the isolation pillar 61 includes a first layer 611 and a second layer 612 that are sequentially stacked in a direction away from the driving back plate 1. Accordingly, as shown in FIG. 11, step S160 may include step S16110-Step S16130.

Step S16110, a first spacer material layer is formed on a side of the first electrode away from the driving back plate.

Step S16120, a second spacer material layer is formed on a side of the first spacer material layer away from the driving back plate.

The material of the first spacer material layer and the second spacer material layer is different, and the etching rates of them two for the same etchant are different. For example, the material of the first spacer material layer may be silicon nitride ($SiN_x$), and the material of the first spacer material layer may be silicon oxide ($SiO_x$).

Step S16130, the second spacer material layer and the first spacer material layer are etched sequentially, to form the first layer and the second layer of each of the isolation pillars, wherein an orthographic projection of the first layer on the driving back plate is smaller than an orthographic projection of the second layer on the driving back plate.

Figure 12:
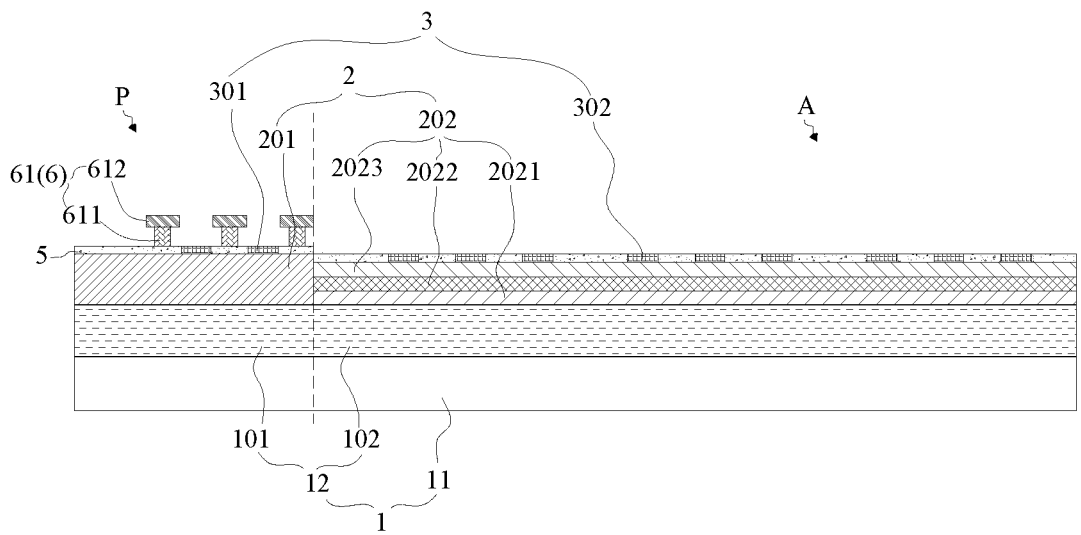
FIG. 12 is a structural schematic view corresponding to step S16130 in FIG. 11.

As shown in FIGS. 1 and 12, through step S16130, the two sidewalls of the isolation pillar 61 can be recessed inward, so that the light emitting layer 3 and the second electrode pattern 4 are disconnected at the sidewalls of the isolation pillar 61.

In some embodiments of the present disclosure, as shown in FIG. 10, based on step S150 and step S160, step S130 may include:

forming a first light emitting portion in the area where the first electrode is exposed by the isolation pillar, and forming a second light emitting portion on the surface of the second electrode away from the driving back plate, wherein the first light emitting portion includes a plurality of first light emitting unit groups, each of the first light emitting unit groups includes a plurality of first light emitting units, each of the first light emitting units fills each of the first openings in a one-to-one correspondence, and each column of the first light emitting unit and the isolation pillars are alternately distributed; the second light emitting portion includes a plurality of second light emitting unit groups, each of the second light emitting unit groups includes a plurality of second light emitting units, and each of the second light emitting units fills each of the second openings in a one-to-one correspondence.

The first light emitting portion 301 and the second light emitting portion 302 can be formed by one patterning process, for example, by one evaporation process. Or, they can also be formed independently. The specific structures of the first light emitting portion 301 and the second light emitting portion 302 can refer to the light emitting layer 2 of the above-mentioned display substrate embodiments, which will not be repeated herein.

In step S140, the structure of the second electrode pattern 4 can refer to the second electrode pattern 4 of the above display substrate embodiments, which will not be repeated herein. In some embodiments of the present disclosure, as shown in FIG. 10, based on the above step S150 and step S160, step S140 may include step S1410 and step S1420.

Step S1410, a first conductive layer covering the second light emitting portion and the second defining portion is formed, and a second conductive material layer is formed on a side of the first conductive layer away from the driving back plate.

The structure of the first conductive layer can refer to the first conductive layer 4021 of the above-mentioned display substrate embodiments, which will not be repeated herein.

Step S1420, a third electrode and a second conductive layer are formed by one patterning process, wherein the third electrode is provided on a side of the first light emitting portion away from the driving back plate, the third electrode and an orthographic projection of the isolation pillar on the driving back plate are alternately distributed, and a film layer made of the same material as the third electrode is formed on a surface of the isolation pillar away from the driving back plate, the second conductive layer is disposed on a surface of the first conductive layer away from the driving back plate.

The number of the third electrode 401 is multiple, and it is used as the cathode of the OLED light emitting structure in area P. It cooperates with the first electrode 202 to apply an electric field to each first light emitting unit of the first light emitting portion, so that each first light emitting unit emits light.

When the third electrode 401 is formed, the second conductive layer 4022 can be formed at the same time. The second conductive layer 4022 covers the surface of the first conductive layer 4021 away from the driving back plate 1 to form the fourth electrode 402. The second conductive layer 4022 is equivalent to an area of the third electrode 401 extending to the surface of the first conductive layer 4021 away from the driving substrate 1, but this area is disconnected from the third electrode 401, so as to reduce the process difficulty and reduce the resistance of the fourth electrode 402. For example, the edge of an isolation pillar 61 can be flush with the boundary line of the P area and the A area. When the second conductive layer 4022 of the fourth electrode 402 and the third electrode 401 are formed by one patterning process, the third electrode 401 and the second conductive layer 4022 may be disconnected due to the height difference formed by the isolation pillar 61, so that the third electrode 401 and the fourth electrode 402 can be independently controlled.

The structure of the third electrode 401 and the fourth electrode 402 can refer to the third electrode 401 and the fourth electrode 402 of the above display substrate embodiments, which will not be repeated herein.

It should be noted that although various steps of the method in the present disclosure are described in a specific order in the drawings, this does not require or imply that these steps must be performed in the specific order, or that all the steps shown must be performed to achieve the desired result. Additionally or alternatively, some steps may be omitted, multiple steps may be combined into one step for execution, and/or one step may be decomposed into multiple steps for execution, or the like.

The embodiments of the present disclosure provide a display apparatus, including the display substrate of any of the above embodiments, which can be used in mobile phones, computers, televisions, electronic paper displays, or the like. Its beneficial effects may refer to the beneficial effects of the above display substrates, which will not be detailed herein.

Figure 13:
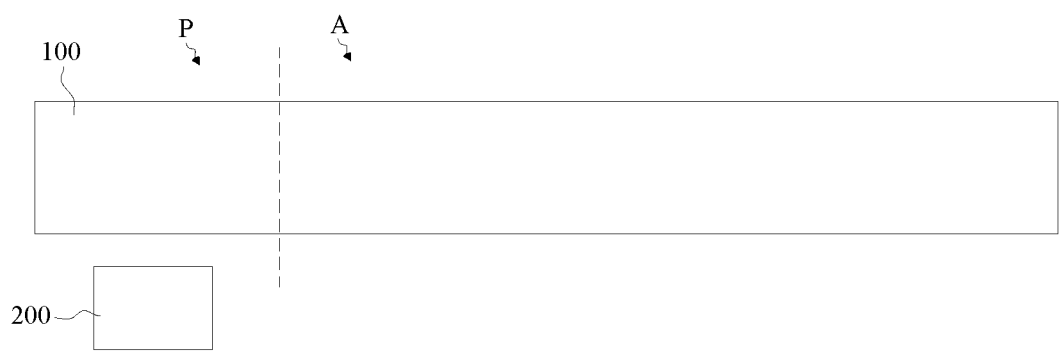
FIG. 13 is a schematic diagram of an embodiment of an electronic device of the present disclosure.

The embodiments of the present disclosure further provide an electronic device, which may be a mobile phone, a computer, a TV, electronic paper, and the like. As shown in FIG. 13, the electronic device includes a photosensitive element 200 and the display apparatus 100 of the above-mentioned embodiments.

The structure of the display apparatus 100 can refer to the display substrate and the display apparatus in the above embodiments, which will not be repeated herein. The photosensitive element 200 can be arranged on the side of the driving back plate 1 away from the light emitting layer 3, and is directly opposite to the first driving area 101 of the driving back plate 1. That is, the projection of the photosensitive element 200 on the driving back plate 1 is located within the first driving area 101. The photosensitive element 200 may be an electronic element that needs to receive light, such as a photoelectric sensor, a camera, and the like, which is not specifically limited herein. The beneficial effects of the electronic device can refer to the beneficial effects of the above-mentioned display substrate, which will not be described in detail herein.

When the display substrate is in full-screen display, the photosensitive element 200 can be turned off. When shooting is required, the P area of the display substrate can be turned off by the first driving circuit 7, so that the photosensitive element 200 can receive light, while the A area can keep displaying images.

Those skilled in the art will easily think of other embodiments of the present disclosure after considering the specification and practicing the disclosure disclosed herein. This application is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are indicated by the appended claims.

What is claimed is:
1. A display substrate, comprising:
a driving back plate, having a first driving area and a second driving area;
a first electrode pattern, provided on a side of the driving back plate and comprising a plurality of transparent first electrodes located in the first driving area and a second electrode located in the second driving area, wherein the first electrode is in a strip shape extending in a first direction and spaced apart in a second direction;

a light emitting layer, provided on a side of the first electrode pattern away from the driving back plate, and comprising a first light emitting portion located in the first driving area and a second light emitting portion located in the second driving area;

a second electrode pattern, provided on a side of the light emitting layer away from the driving back plate, and comprising a plurality of transparent third electrodes located in the first driving area and a fourth electrode located in the second driving area, wherein the third electrode is in a strip shape extending in the second direction and spaced apart in the first direction, wherein the display substrate further comprises:

a spacer layer, comprising a plurality of strip-shaped isolation pillars extending along the second direction and spaced apart in the first direction, wherein an isolation pillar of the plurality of strip-shaped isolation pillars comprises a first layer and a second layer sequentially laminated along a direction away from the driving back plate, and materials of the first layer and the second layer are different, and etching rates of the first layer and the second layer for a same etchant are different.

2. The display substrate according to claim 1, wherein an angle between the first direction and the second direction is between 80 degrees to 100 degrees, the first electrode penetrates through the first driving area along the first direction, and the third electrode penetrates through the first driving area along the second direction.

3. The display substrate according to claim 1, wherein the second electrode is a light shielding structure, and the fourth electrode is a transparent structure.

4. The display substrate according to claim 1, wherein the second electrode comprises a first transparent conductive layer, a metal layer and a second transparent conductive layer sequentially laminated in a direction away from the driving back plate;

the fourth electrode comprises a first conductive layer and a second conductive layer sequentially laminated in a direction away from the driving back plate.

5. The display substrate according to claim 4, wherein material of the first electrode is the same as that of the first transparent conductive layer and the second transparent conductive layer of the second electrode; and material of the third electrode is the same as that of the second conductive layer of the fourth electrode.

6. The display substrate according to claim 1, wherein the display substrate further comprises:

a pixel defining layer, located on a side of the first electrode pattern away from the driving back plate and comprising a first defining portion located in the first driving area and a second defining portion located in the second driving area, wherein the first defining portion has a plurality of first openings distributed in an array, each first opening exposes a respective first electrode, the first light emitting portion comprises a plurality of first light emitting units corresponding to the plurality of first openings, each first light emitting unit of the plurality of first light emitting units comprises a portion located within a corresponding first opening; the second defining portion has a plurality of second openings distributed in an array, each second opening exposes the second electrode, the second light emitting portion comprises a plurality of second light emitting units corresponding to the plurality of second openings, each second light emitting unit of the plurality of second light emitting units comprises a portion located within the corresponding second opening;

wherein the spacer layer is located on a side of the first defining portion away from the driving back plate, wherein the third electrode and an orthographic projection of the isolation pillar on the driving back plate are alternately distributed, and a film layer made of the same material as the third electrode is formed on a surface of the isolation pillar away from the driving back plate.

7. The display substrate according to claim 6, wherein the first light emitting units are classified into a plurality of first light emitting unit groups, and a same first light emitting unit group comprises three first light emitting units with different emission colors, the first light emitting units located in a same row in the first direction are directly opposite to a same first electrode, and the first light emitting units located in a same column in the second direction are directly opposite to a same third electrode, each first light emitting unit is configured to emit light under driving of the first electrode and the third electrode directly opposite to the first light emitting unit; the second light emitting units are classified into a plurality of second light emitting unit groups, and a same second light emitting unit group comprises four of the second light emitting units, each of the second light emitting units is directly opposite to each of the second electrodes one by one, and the fourth electrode is a common electrode, corresponding to all the second light emitting units, each second light emitting unit is configured to emit light under driving of the second electrode and the fourth electrode directly opposite to the second light emitting unit; at most two of the second light emitting units in the same second light emitting unit group emit light in a same color.

8. The display substrate according to claim 6, wherein an orthographic projection of the first layer on the driving back plate is smaller than an orthographic projection of the second layer on the driving back plate.

9. The display substrate according to claim 8, wherein an orthographic projection of the first layer on the driving back plate is located within an orthographic projection of the second layer on the driving back plate.

10. The display substrate according to claim 1, wherein a thickness of the first electrode is greater than that of the second electrode.

11. The display substrate according to claim 1, wherein a transmittance rate of the third electrode is greater than that of the fourth electrode.

12. A method of manufacturing a display substrate, comprising:

forming a driving back plate having a first driving area and a second driving area;

forming a first electrode pattern on a side of the driving back plate, wherein the first electrode pattern comprises a plurality of transparent first electrodes located in the first driving area and a second electrode located in the second driving area, the first electrode is in a strip shape and spaced apart in a second direction;

forming a light emitting layer on a side of the first electrode pattern away from the driving back plate, wherein the light emitting layer comprises a first light emitting portion located in the first driving area and a second light emitting portion located in the second driving area;

forming a second electrode pattern on a side of the light emitting layer away from the driving back plate, wherein the second electrode pattern comprises a plurality of transparent third electrodes located in the first driving area and a fourth electrode located in the second driving area, and the third electrode is in a strip shape and spaced apart in a first direction, wherein the forming the first electrode pattern on a side of the driving back plate comprises:

forming the first electrode in the first driving area;

forming a first transparent conductive layer covering the first electrode and the second driving area of the driving back plate;

forming a metal layer covering the first transparent conductive layer;

forming a second transparent conductive layer covering the metal layer;

removing the second transparent conductive layer, the metal layer and the first transparent conductive layer of the first driving area through a patterning process, to form a second electrode.

13. The manufacturing method according to claim 12, wherein after forming the first electrode pattern and before forming the light emitting layer, the manufacturing method further comprises:

forming a pixel defining layer on a side of the first electrode pattern away from the driving back plate, wherein the pixel defining layer comprises a first defining portion located in the first driving area and a second defining portion located in the second driving area, the first defining portion has a plurality of first openings distributed in an array, each first opening exposes a respective first electrode, the second defining portion has a plurality of second openings distributed in an array, and each second opening exposes the second electrode;

forming a spacer layer on a side of the first defining portion away from the driving back plate, wherein the spacer layer comprises a plurality of strip-shaped isolation pillars extending along the second direction and spaced apart in the first direction, wherein the first light emitting portion comprises a plurality of first light emitting units corresponding to the plurality of first openings, each first light emitting unit of the plurality of first light emitting units comprises a portion located within a corresponding first opening; the second light emitting portion comprises a plurality of second light emitting units corresponding to the plurality of second openings, each second light emitting unit of the plurality of second light emitting units comprises a portion located within the corresponding second opening.

14. The manufacturing method according to claim 13, wherein an isolation pillar of the plurality of strip-shaped isolation pillars comprises a first layer and a second layer sequentially laminated along a direction away from the driving back plate; the forming a spacer layer on a side of the first defining portion away from the driving back plate comprises:

forming a first spacer material layer on a side of the first defining portion away from the driving back plate;

forming a second spacer material layer on a side of the first spacer material layer away from the driving back plate;

etching the second spacer material layer and the first spacer material layer sequentially, to form the first layer and the second layer of each isolation pillar, wherein an orthographic projection of the first layer on the driving back plate is smaller than an orthographic projection of the second layer on the driving back plate.

15. The manufacturing method according to claim 13, wherein the forming the second electrode pattern on the side of the light emitting layer away from the driving back plate comprises:

forming a first conductive layer covering the second light emitting portion and the second defining portion, and forming a second conductive layer on a side of the first conductive layer away from the driving back plate;

forming a third electrode using material deposited between the isolation pillars;

wherein forming the third electrode and the second conductive layer is by a one patterning process, wherein the third electrode is provided on a side of the first light emitting portion away from the driving back plate, the third electrode and an orthographic projection of the isolation pillar on the driving back plate are alternately distributed, and a film layer made of a same material as the third electrode is formed on a surface of the isolation pillar away from the driving back plate, the second conductive layer is disposed on a surface of the first conductive layer away from the driving back plate.

16. A display apparatus, comprising a display substrate, wherein the display substrate comprises:

a driving back plate, having a first driving area and a second driving area;

a first electrode pattern, provided on a side of the driving back plate and comprising a plurality of transparent first electrodes located in the first driving area and a second electrode located in the second driving area, wherein the first electrode is in a strip shape extending in a first direction and spaced apart in a second direction;

a light emitting layer, provided on a side of the first electrode pattern away from the driving back plate, and comprising a first light emitting portion located in the first driving area and a second light emitting portion located in the second driving area;

a second electrode pattern, provided on a side of the light emitting layer away from the driving back plate, and comprising a plurality of transparent third electrodes located in the first driving area and a fourth electrode located in the second driving area, wherein the third electrode is in a strip shape extending in the second direction and spaced apart in the first direction, wherein the display substrate further comprises:

a spacer layer, comprising a plurality of strip-shaped isolation pillars extending along the second direction and spaced apart in the first direction, wherein an isolation pillar of the plurality of strip-shaped isolation pillars comprises a first layer and a second layer sequentially laminated along a direction away from the driving back plate, and materials of the first layer and the second layer are different, and etching rates of the first layer and the second layer for a same etchant are different.

17. The display apparatus according to claim 16, wherein an angle between the first direction and the second direction is between 80 degrees to 100 degrees, the first electrode penetrates through the first driving area along the first direction, and the third electrode penetrates through the first driving area along the second direction.

18. The display apparatus according to claim 16, wherein the second electrode is a light shielding structure, and the fourth electrode is a transparent structure.

19. An electronic device, comprising:
the display apparatus according to claim 16; and
a photosensitive element, arranged on a side of the driving back plate away from the light emitting layer and directly opposite to the first driving area.

* * * * *

UNITED STATES PATENT AND TRADEMARK OFFICE
CERTIFICATE OF CORRECTION

PATENT NO. : 12,219,840 B2  
APPLICATION NO. : 17/418075  
DATED : February 4, 2025  
INVENTOR(S) : Yang Wang Page 1 of 1

It is certified that error appears in the above-identified patent and that said Letters Patent is hereby corrected as shown below:

On the Title Page

Please correct the second Assignee in item (73) to read as follows:  
---BOE TECHNOLOGY GROUP CO., LTD., Beijing (CN)---

Signed and Sealed this  
Twenty-fourth Day of June, 2025

Coke Morgan Stewart  
*Acting Director of the United States Patent and Trademark Office*